(12) United States Patent
Kim et al.

(10) Patent No.: US 7,972,931 B2
(45) Date of Patent: Jul. 5, 2011

(54) TOP-GATE THIN-FILM TRANSISTORS USING NANOPARTICLES AND METHOD OF MANUFACTURING THE SAME

(75) Inventors: Sangsig Kim, Seoul (KR); Kyoung-Ah Cho, Seoul (KR); Dong-Won Kim, Seoul (KR); Jae-Won Jang, Daegu (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 1088 days.

(21) Appl. No.: 11/623,775

(22) Filed: Jan. 17, 2007

(65) Prior Publication Data

US 2007/0228376 A1    Oct. 4, 2007

(30) Foreign Application Priority Data

Mar. 30, 2006  (KR) .................. 10-2006-0029098
Oct. 10, 2006  (KR) .................. 10-2006-0098467

(51) Int. Cl.
*H01L 21/477*    (2006.01)

(52) U.S. Cl. ......... 438/293; 257/78; 257/288; 257/410; 257/E21.535; 257/E29.296; 438/151; 438/285; 438/287; 977/773; 977/824; 977/892; 977/936

(58) Field of Classification Search .......... 257/78, 257/288, 410, E29.296, E21.535; 438/151, 438/285, 287, 293; 977/773, 824, 892, 936
See application file for complete search history.

(56) References Cited

U.S. PATENT DOCUMENTS

| | | | |
|---|---|---|---|
| 6,294,401 B1 * | 9/2001 | Jacobson et al. | 438/99 |
| 7,422,708 B2 * | 9/2008 | Kunze et al. | 252/521.3 |
| 7,507,618 B2 * | 3/2009 | Dunbar | 438/197 |
| 7,553,545 B2 * | 6/2009 | Kunze et al. | 428/446 |
| 2004/0171280 A1 | 9/2004 | Conley, Jr. et al. | |
| 2005/0008880 A1 * | 1/2005 | Kunze et al. | 428/447 |
| 2005/0071969 A1 * | 4/2005 | Sirringhaus et al. | 29/4.51 |
| 2006/0014365 A1 * | 1/2006 | Kugler et al. | 438/502 |
| 2006/0060857 A1 * | 3/2006 | Mardilovich et al. | 257/66 |
| 2006/0071205 A1 * | 4/2006 | Nauka | 257/20 |
| 2006/0088962 A1 * | 4/2006 | Herman et al. | 438/151 |
| 2006/0292777 A1 * | 12/2006 | Dunbar | 438/197 |

OTHER PUBLICATIONS

Ridley et al., All-Inorganic Field Effect Transistors Fabricated by Printing, Science 286, 746 (1999).*
Kim et al., Temperature-Dependent Gate Effect of Sintered HgTe Nanoparticles, Japanese Journal of Applied Physics, vol. 45, No. 9A, 2006, pp. 7213-7216.*
Kim et al., Bottom- and top-gate field-effect thin-film transistors with p channels of sintered HgTe nanocrystals, Applied Physics Letters 89, 173107 (2006).*

(Continued)

*Primary Examiner* — Anh Phung
*Assistant Examiner* — Michael Lulis
(74) *Attorney, Agent, or Firm* — Locke Lord Bissell & Liddell LLP

(57) ABSTRACT

The present invention relates to a method of manufacturing thin-film transistors using nanoparticles and thin film transistors manufactured by the method. A hydrophilic buffer layers are deposited on the substrates to facilitate formation of nanoparticle films. Sintered nanoparticles are used as an active layer and dielectric materials of high dielectric coefficient are also used as a gate dielectric layer to form a top gate electrode on the gate dielectric layer, thereby enabling low-voltage operation and low-temperature fabrication.

17 Claims, 4 Drawing Sheets

OTHER PUBLICATIONS

Kim et al., HgTe Nanocrystal-Based Thin-Film Transistors Fabricated on Glass Substrates, IEEE Electron Device Letters, vol. 28, No. 1, Jan. 2007.*

Lim et al., Low-Temperature Growth of SiO2 Films by Plasma-Enhanced Atomic Layer Deposition, ETRI Journal, vol. 27, No. 1, Feb. 2005, pp. 118-121.*

* cited by examiner

TOP-GATE THIN-FILM TRANSISTORS USING NANOPARTICLES AND METHOD OF MANUFACTURING THE SAME

BACKGROUND OF THE INVENTION

1. Field of the Invention

The present invention relates to a method of manufacturing thin-film transistors using nanoparticles and thin-film transistors manufactured by the method. More particularly, the present invention relates to top-gate thin-film transistors formed on flexible substrates using nanoparticles and a method of manufacturing the same, in which hydrophilic buffer layers are deposited on the substrates to facilitate formation of nanoparticle films, and sintered nanoparticles are used as channel layers of the thin-film transistors and dielectric materials of high dielectric constant are also used as gate layers to form top gate electrodes on the gate dielectric layers, thereby enabling low-voltage operation and low-temperature fabrication.

2. Description of the Related Art

In general, field-effect thin-film transistors currently used in flat panel display including a liquid crystal display (LCD) are manufactured by using amorphous silicon (a-Si:H) or polycrystalline silicon as channel layers, and by using silicon oxide or nitride as gate dielectric layers.

In recent years, extensive researches on the manufacture of thin-film transistors using organic materials such as pentacene or hexathiophene have been made in order to enable a low-temperature process and low-cost fabrication. However, such organic thin-film transistors have inherent limitations in view of mobility, physical and chemical stability and the like. Further, there are difficulties in that the organic thin-film transistors are directly applied to processes studied so far for inorganic semiconductors.

In order to overcome such difficulties, B. A. Ridley, B. Nivi, and J. M. Jacobson in MIT fabricated thin-film transistors using CdSe nanoparticles in 1999 (see Science, vol. 286, p. 746).

In the study, a representative transistor with a field effect mobility of about 1 $cm^2/Vsec$ and an on/off current ratio of $10^4$ or more has been manufactured to propose a possibility of a thin-film transistor with channels composed of nanoparticles. In 2005, D. V. Talapin and C. B. Murray in IBM also manufactured thin-film transistors with channels composed of PbSe nanoparticles (see Science, vol. 310, p. 86).

In this study, hydrazine was chemically treated on nanoparticle films to improve the conductivity of the films. Further, n- and p-channel transistors were manufactured through the heat treatment. When inorganic semiconductor nanoparticles are employed in this way, an advantage of processes in such a solution state as in an organic thin film transistor can be achieved and basic problems associated with organic materials can also be solved.

However, transistors developed so far using inorganic semiconductor nanoparticles, including most organic thin film transistors, are back-gate transistors which use $SiO_2$, i.e. oxidized silicon substrates, as gate dielectric layers. Thus, a gate voltage of several tens volts or more is required to operate the transistors.

SUMMARY OF THE INVENTION

The present invention is conceived to solve the aforementioned problems in the prior art. An object of the present invention is to provide top-gate thin-film transistors with channels composed of nanoparticle films formed on flexible substrates and a method of manufacturing the same, in which hydrophilic buffer layers are deposited on the flexible substrates to facilitate formation of nanoparticle films, and sintered nanoparticles are used as channel layers and gate dielectric layers are formed on the nanoparticle films, thereby enabling low-voltage operation and low-temperature fabrication.

According to the present invention for achieving the object, there is provided a method of manufacturing thin-film transistors using nanoparticles, which comprises the steps of forming nanoparticle films on substrates and sintering the film; forming source and drain electrodes on the nanoparticle films; forming gate dielectric layers by depositing dielectric materials on the nanoparticle films with the source and drain electrodes formed thereon; and forming a top gate electrode on the gate dielectric layer.

The method of the present invention may further comprise the step of depositing buffer layers between the substrates and the nanoparticle films using hydrophilic materials.

Preferably, the substrate is selected from the group consisting of silicon substrates, glass substrates and flexible substrates.

Preferably, the flexible substrates are plastic substrates and the plastic substrate is one of PET (Polyethylene Terephthalate), PEN (Polyethyle Napthalate), PC (polycarbonate) and PES (Polyether Sulfone).

The buffer layers may be formed of hydrophilic inorganic materials or hydrophilic organic materials. Preferably, the hydrophilic inorganic material is selected from the group consisting of $Al_2O_3$, $HfO_2$, $Ta_2O_5$, $La_2O_3$ and $SiO_2$.

The hydrophilic inorganic materials may be formed using an atomic layer deposition (ALD) method or a sputtering method or a metal organic chemical vapor deposition (MOCVD) method.

Preferably, the organic material is selected from the group consisting of AIDCN, polyaniline, Cd-AA (Arachidate), PVP, PVA and PEDOT. Further, a surface of the organic materials may be made hydrophilic through an ultraviolet process using $O_3$ as a reaction gas or a plasma process using $O_2$ as a reaction gas.

The organic materials may be deposited through any one of a spin coating method, a spraying method, a Langmuir-Blodgett method and a printing method.

Preferably, the buffer layers have a thickness of 2 to 20 nm.

Preferably, the buffer layers are deposited on the substrates at a temperature of 100 to 150° C.

The step of forming nanoparticle films may comprise the steps of preparing nanoparticle solutions by dispersing nanoparticles into solvents; mixing a precipitating agent with the nanoparticle solutions; and depositing the nanoparticle solutions containing the precipitating agent on the substrates.

Preferably, the nanoparticles are selected from the group consisting of HgTe, HgSe, HgS, CdTe, CdSe, CdS, ZnTe, ZnSe, ZnS, PbTe, PbSe, PbS and ZnO. The nanoparticle solutions containing the precipitating agent may be deposited on the substrates through any one of a spin coating method, a deep coating method, a stamping method, a spraying method, a Langmuir-Blodgett method and a printing method.

Preferably, the sintering step is carried out for 10 to 200 minutes at a temperature of 100 to 185° C.

Preferably, the gate dielectric layers are formed by depositing dielectric materials of high dielectric constant on the nanoparticle films, and the dielectric materials are inorganic materials such as any one of $Al_2O_3$, $HfO_2$, $Ta_2O_5$, $La_2O_3$, $SiO_2$ or organic materials such as any one of AIDCN, polyaniline, Arachidate, PVP, PVA, PEDOT.

Preferably, when the dielectric materials of high dielectric constant are deposited on the nanoparticle films, the substrate has a temperature of 100 to 185° C. and the gate dielectric layers have a thickness of 10 to 500 nm.

According to another aspect of the present invention, there is provided top-gate thin-film transistors with channels composed of nanoparticles, which comprises buffer layers formed by depositing hydrophilic materials on flexible substrates; nanoparticle films deposited and sintered on the buffer layers; source and drain electrodes formed on the nanoparticle films; a gate dielectric layer formed by depositing dielectric materials on the nanoparticle films with the source and drain electrodes formed thereon; and a top-gate electrode formed on the gate dielectric layers.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE INVENTION

Hereinafter, a preferred embodiment of a method of manufacturing a thin-film transistor using nanoparticles according to the present invention will be described in detail with reference to the accompanying drawings.

A method of manufacturing a thin-film transistor using nanoparticles according to the present invention basically comprises the steps of forming a nanoparticle film on a substrate and then sintering the nanoparticle film, forming source and drain electrodes on the nanoparticle film, forming a gate dielectric layer by depositing dielectric material on the nanoparticle film formed with the source and drain electrodes, and forming a top gate electrode on the gate dielectric layer.

The method of manufacturing thin-film transistors using nanoparticles according to the present invention may further comprise the step of depositing buffer layers between the substrate and the nanoparticle film using hydrophilic materials. At this time, the substrate may be any one of silicon substrates, glass substrates and flexible substrates.

Hereinafter, only a method of manufacturing thin-film transistors using nanoparticles according to the present invention, which includes buffer layers formed between the substrate and the nanoparticle film using hydrophilic materials, will be described. However, the following description will be applied similarly to a method of manufacturing a thin-film transistor using nanoparticles, which does not include the buffer layer.

FIGS. 1 to 4 are sectional views illustrating a process of manufacturing a top-gate thin-film transistor using nanoparticles according to the present invention.

Figure 1:
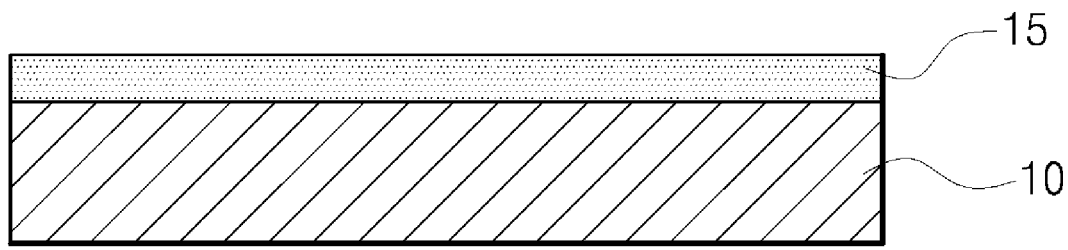
FIGS. 1 to 4 are sectional views illustrating a process of manufacturing a top-gate thin-film transistor on a flexible substrate using nanoparticles according to an embodiment of the present invention.

As shown in FIG. 1, a buffer layer 15 is formed on a flexible substrate 10 using a hydrophilic material. A variety of substrates may be used as the flexible substrate 10 so long as they are merely flexible. For example, a flexible plastic substrate may be employed.

Since the thin-film transistors of the present invention can be fabricated in a low temperature process, a plastic substrate can be employed. In a case where a flexible plastic substrate is used as the flexible substrate 10, any one of the plastic substrates such as PET (Polyethylene Terephthalate), PEN (Polyethyle Napthalate), PC (polycarbonate) and PES (Polyether Sulfone) substrates can be employed.

The buffer layer 15 formed on the plastic substrate 10 is formed of a hydrophilic inorganic material or a hydrophilic organic material. That is, the buffer layer 15 may be formed of an inorganic or organic material. Preferably, the buffer layer is formed of a hydrophilic material.

In a case where the buffer layer 15 is formed of a hydrophilic inorganic material, any one of inorganic materials such as $Al_2O_3$, $HfO_2$, $Ta_2O_5$, $La_2O_3$ and $SiO_2$ can be employed. The hydrophilic inorganic material, $Al_2O_3$, can be deposited through various methods. In the present invention, ALD, MOCVD and sputtering can be used to deposit any one of the hydrophilic inorganic materials such as $Al_2O_3$, $HfO_2$, $Ta_2O_5$, $La_2O_3$ and $SiO_2$ on the plastic substrate 10 such that a buffer layer 15 can be formed.

On the other hand, in a case where the buffer layer 15 is formed of a hydrophilic organic material, it is selected from any one of organic materials such as AlDCN, polyaniline, Cd-AA (Arachidate), PVP, PVA and PEDOT. The organic material should be treated to exhibit a hydrophilic property. Thus, the organic material is treated to have a hydrophilic surface through an ultraviolet process using $O_3$ as reaction gas or a plasma process using $O_2$ as reaction gas.

The hydrophilic organic materials can be deposited through various methods. The present invention may employ any one of a spin coating method, a spraying method, a Langmuir-Blodgett method and a printing method.

The buffer layer 15 may be formed to have various thicknesses. It is preferred that the buffer layer 15 be deposited to have a thickness of 2 to 20 nm. When a buffer layer 15 is formed to have the aforementioned thickness, it is deposited on the substrate at a relatively low deposition temperature of 100 to 150° C.

By forming a buffer layer 15 on a plastic substrate 10, the following advantageous effects can be achieved. That is, a problem can be overcome in that a nanoparticle solution to be explained later cannot be properly deposited on the plastic substrate 10 due to its hydrophobicity.

Figure 2:
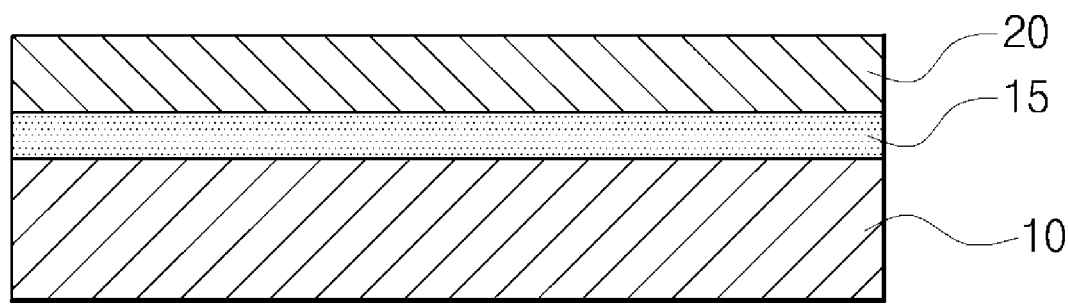

After the buffer layer 15 has been formed on the plastic substrate 10 in this way, a nanoparticle film 20 is formed on the buffer layer 15 as shown in FIG. 2.

A process of forming a nanoparticle film on the buffer layer 15 will be described hereinafter in detail.

First, desired nanoparticles are dispersed in a solvent to prepare a nanoparticle solution. At this time, the concentration of nanoparticles is preferably 0.01 to 1 mg/μl. Then, a precipitating agent such as 2-propanol is mixed with the nanoparticle solution.

At this time, the volume ratio of the mixture is 1:100 to 1:1. Then, the nanoparticle solution containing the precipitating agent is deposited on the buffer layer 15 to form the nanoparticle film 20 on the buffer layer 15.

A variety of nanoparticle may be employed in the above process. In the present invention, any one of semiconductor nanoparticles including HgTe, HgSe, HgS, CdTe, CdSe, CdS, ZnTe, ZnSe, ZnS, PbTe, PbSe, PbS, ZnO and the like may be employed.

In addition, the nanoparticle film 20 can be formed on the buffer layer 15 by causing the nanoparticle solution containing the precipitating agent to be deposited on the buffer layer 15 using a spin coating method, a deep coating method, a stamping method, a spraying method, a printing method and other various solution treating techniques.

After the nanoparticle film 20 has been formed on the buffer layer 15 in the same process as described above, the nanoparticle film 20 is heat-treated or sintered at a predetermined temperature. This sintering process is performed for 10 to 200 minutes at a temperature of 100 to 185° C. depending on the kinds of nanoparticles. Since a currently available flexible PES plastic substrate has a melting temperature of 185° C., the nanoparticle film can be sintered at such a lower temperature as described above.

This sintering process functions not only to improve the crystallinity of the nanoparticle film and thus to enhance the mobility, but also to improve the adhesion between the nanoparticle film and the substrate, i.e. to prevent the nanoparticle layer and the substrate from being separated from each other due to reduction in the adhesion which may occur during a photolithographic process.

Figure 5:
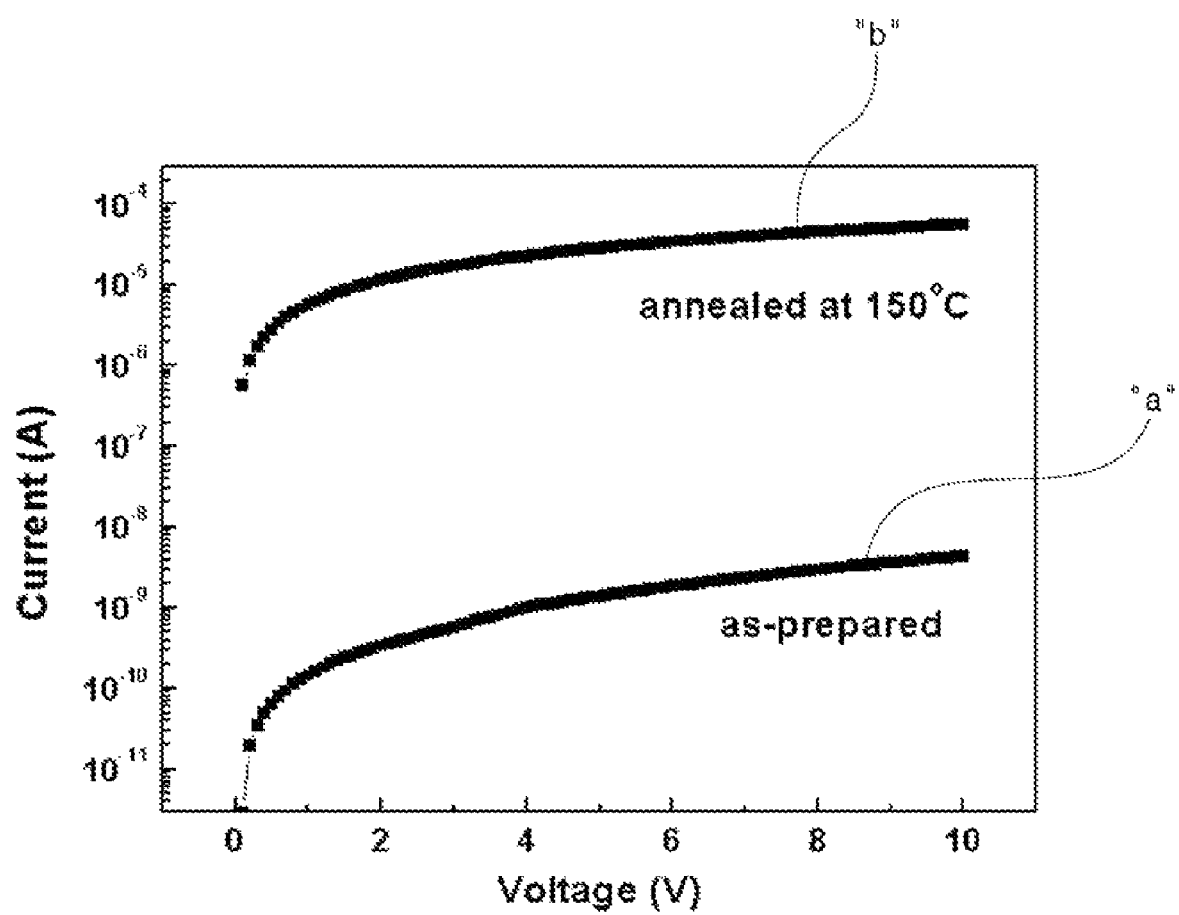
FIG. 5 is a graph showing the measurement of current of a sintered HgTe nanoparticle film for 180 minutes at 150° C. according to an embodiment of the present invention.

FIG. 5 is a graph showing the measurement of current of a sintered HgTe nanoparticle film for 180 minutes at 150° C. As shown in FIG. 5, when comparing the sintered film (curve 'b') with the as-prepared film (curve 'a'), it can be seen that the current of the sintered film is increased by $10^5$ times or more. The sintered nanoparticle film 20 can serve as a channel layer.

Figure 3:
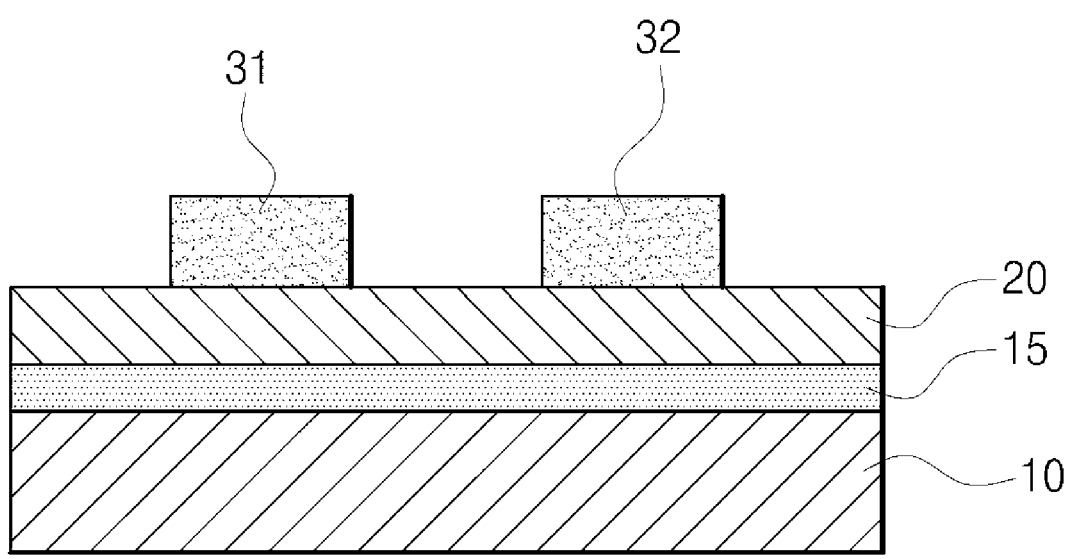
Figure 4:
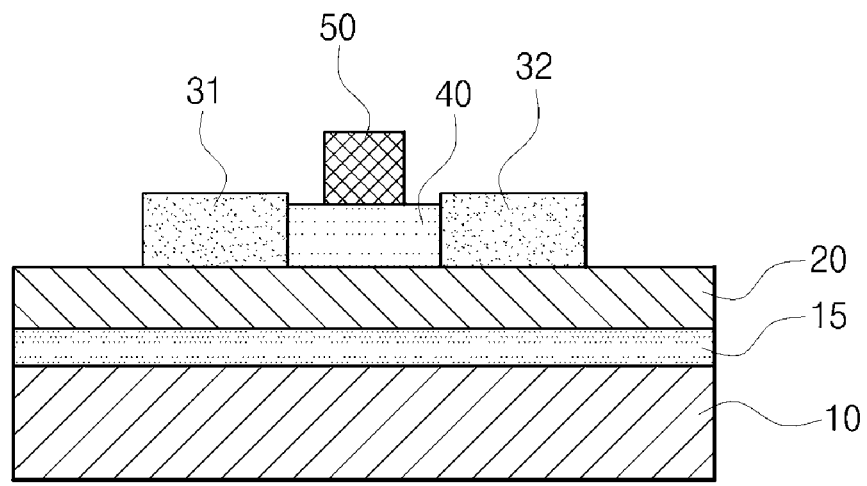

After the nanoparticle film has been sintered in this way, source and drain electrodes 31 and 32 are formed on the nanoparticle film 20, as shown in FIG. 3, using an electron beam or photolithographic method or a metallic mask.

After the source and drain electrodes 31 and 32 have been formed on the nanoparticle film 20 in this way, a dielectric material of high dielectric constant is deposited on the nanoparticle film 20, on which the source and drain electrodes 31 and 32 are formed, to thereby form a gate dielectric layer 40. Then, a gate electrode 50 is formed on the gate dielectric layer 40 using an electron beam or photolithographic method or a metallic mask.

The gate dielectric layer 40 is formed by depositing a dielectric material of high dielectric constant on the nanoparticle film 20. Preferably, such a dielectric material is any one of inorganic dielectric materials including $Al_2O_3$, $HfO_2$, $Ta_2O_5$, $La_2O_3$, $SiO_2$ and the like, and organic dielectric materials including AIDCN, polyaniline, Arachidate, PVP, PEDOT and the like.

When such a dielectric material is deposited on the nanoparticle film, it is preferred that the temperature of the substrate be within a range of 100 to 185° C. and the thickness of the gate dielectric layer be within a range of 10 to 500 nm.

Figure 6:
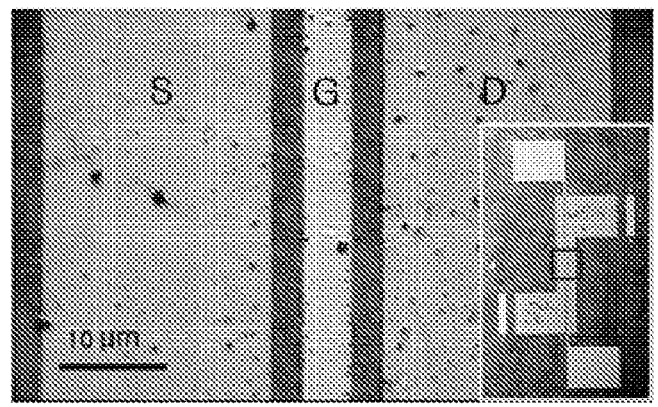
FIG. 6 is a photomicrograph showing a top surface of a top-gate thin-film transistor according to an embodiment of the present invention.
Figure 7:
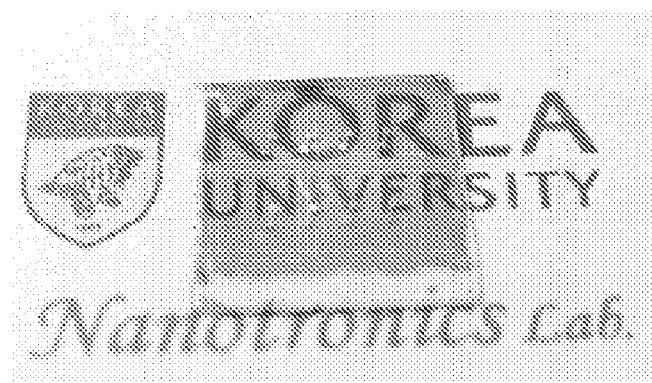
FIG. 7 is a photograph showing a top-gate transistor manufactured using a plastic substrate according to an embodiment of the present invention.
Figure 8:
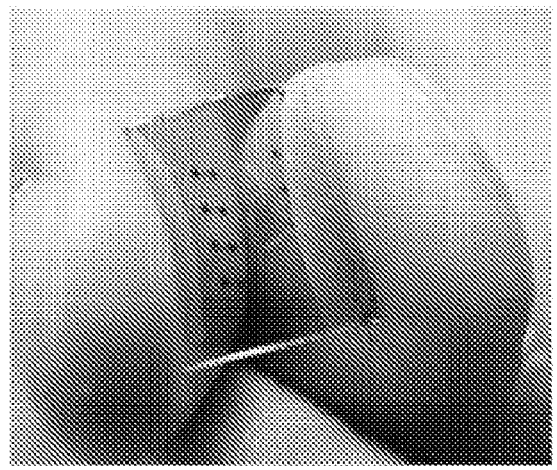
FIG. 8 is a photograph showing a bent state of the top-gate transistor manufactured using a plastic substrate according to an embodiment of the present invention.

FIG. 6 is a photomicrograph showing a top surface of a top-gate thin film transistor manufactured using a plastic substrate so configured. FIG. 7 is a photograph showing a top-gate transistor manufactured on a transparent plastic substrate according to an embodiment of the present invention, and FIG. 8 is a photograph showing a bent state of the top-gate transistor manufactured on the transparent plastic substrate according to an embodiment of the present invention. As shown in FIGS. 7 and 8, in a case where a top-gate thin-film transistor is manufactured using a transparent plastic substrate, the top-gate thin film transistor can have transparency and flexibility.

Figure 9:
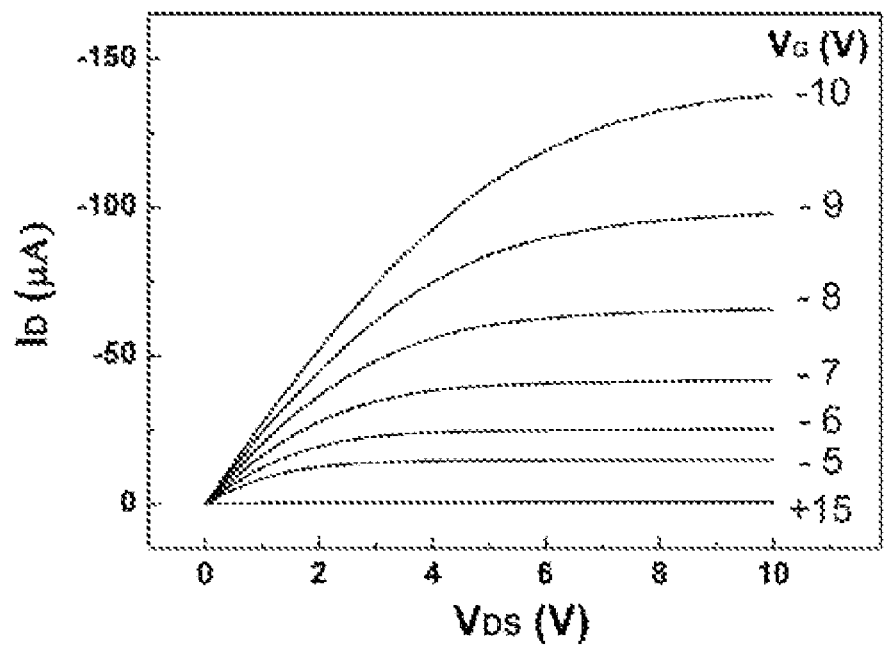
FIGS. 9 and 10 are graphs showing the characteristics of a top-gate transistor formed on a plastic substrate according to an embodiment of the present invention.
Figure 10:
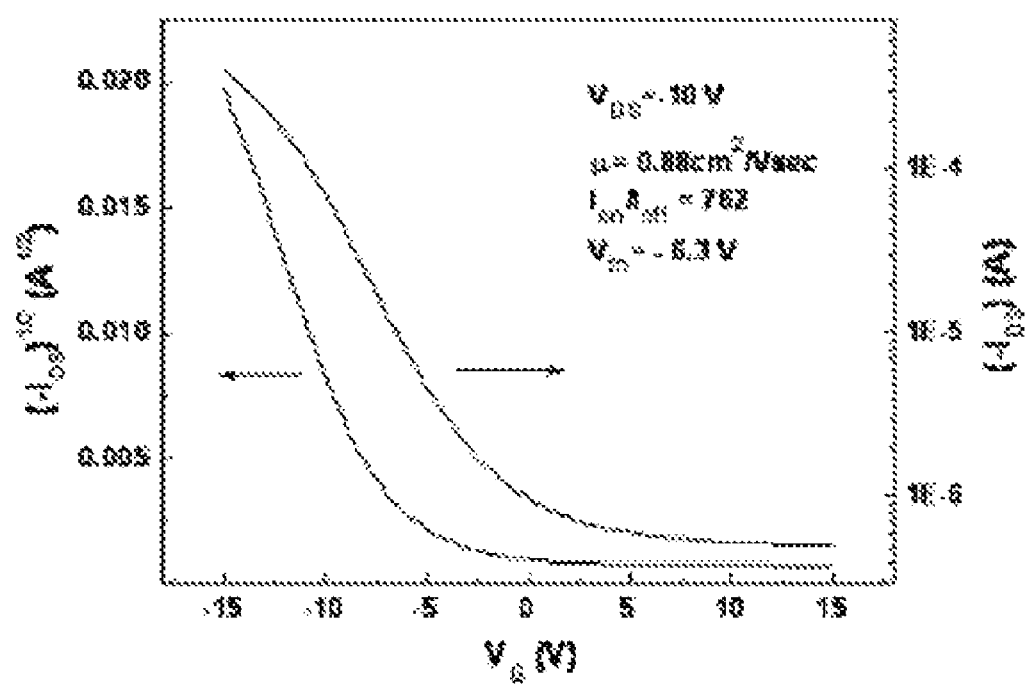

FIGS. 9 and 10 are graphs showing the characteristics of a top-gate transistor formed on a plastic substrate according to an embodiment of the invention. Here, a HgTe nanoparticle film is used as the channel layer and an $Al_2O_3$ gate dielectric layer with a thickness of 60 nm, which was deposited through an ALD method, is employed as a top gate. The source-drain distance is 10 μm and the width is 1000 μm.

FIG. 9 shows the dependency of drain current ($I_D$) upon voltage ($V_{DS}$) applied to the drain and source electrodes with respect to discontinuous gate voltages ($V_G$). As the gate voltage decreases, the drain current increases. Thus, it means a p-channel transistor.

FIG. 10 shows a plot of gate voltage versus drain current. At a fixed $V_{DS}$=10V, the field effect mobility is 0.88 cm$^2$/Vs, which is calculated from the slope of $\sqrt{|I_D|}$ versus $V_G$ curve. Furthermore, an example in which a top-gate thin-film transistor has been manufactured on a plastic substrate using a nanoparticle solution has not yet been reported. Thus, it has been attempted for the first time in the present invention.

According to a top-gate thin-film transistor using nanoparticles and a method of manufacturing the same, a hydrophilic buffer layer is deposited on a substrate to facilitate formation of a nanoparticle film. Further, the nanoparticle film serves as a channel layer on a plastic substrate and a dielectric material of high dielectric constant is used as a top-gate dielectric layer to thereby to form a top-gate thin-film transistor capable of performing a low-voltage operation. Thus, since the manufacturing process can be performed at a low temperature, the present invention can be applied to a flexible plastic substrate or a transparent substrate. In addition, since the process can be made at a solution state, the manufacturing costs for thin film transistors can be reduced.

Further, since a plastic substrate can be employed, a transparent and flexible thin-film transistor can be obtained accordingly. In particular, since a large-sized transistor can be obtained and a nanoparticle layer can also be deposited at a room temperature, expensive vacuum equipment is not required. Therefore, it results in the reduction of manufacturing costs and thus high industrial applicability.

Furthermore, since inorganic semiconductor nanoparticles are used to manufacture a semiconductor thin-film transistor, the manufactured transistor can exhibit high charge mobility, high chemical stability, high thermal durability and strong resistance to high voltage.

In addition, the channel of the conventional semiconductor thin-film transistors formed on a plastic substrate are amorphous or polycrystalline. According to the invention, however, the channel of the semiconductor thin-film transistor formed on a plastic substrate using nanoparticles is almost formed of a single crystal material, resulting in higher charge mobility.

Although the structure and operation of the top-gate thin-film transistor using nanoparticles and the method of manufacturing the same according to the present invention have been illustrated and described in connection with the preferred embodiment, it is only for illustrative purposes. It will be readily understood by those skilled in the art that various modifications and changes can be made thereto without departing from the spirit and scope of the present invention defined by the appended claims.

What is claimed is:
1. A method of manufacturing thin-film transistors using nanoparticles, comprising the steps of:

depositing a buffer layer on a substrate using a hydrophilic material;
forming a nanoparticle film on the buffer layer ;
sintering nanoparticle films on the buffer layer;
forming a source and drain electrodes on the nanoparticle film;
forming a gate dielectric film by depositing a dielectric material on the nanoparticle film with the source and drain electrodes formed thereon; and
forming a top-gate electrode on the gate dielectric film,
wherein the step of forming a nanoparticle film comprises the steps of:
preparing a nanoparticle solution by dispersing nanoparticles into a solvent;
mixing a precipitating agent with the nanoparticle solution; and
depositing the nanoparticle solution containing the precipitating agent on the substrate.

2. The method as claimed in claim 1, wherein the substrate is selected from the group consisting of silicon substrates, glass substrates and flexible substrates.

3. The method as claimed in claim 2, wherein the flexible substrate includes a plastic substrate.

4. The method as claimed in claim 3, wherein the plastic substrate is one of PET (Polyethylene Terephthalate), PEN (Polyethyle Napthalate), PC (Polycarbonate) and PES (Polyether Sulfone).

5. The method as claimed in claim 1, wherein the buffer layer is formed of a hydrophilic inorganic material or a hydrophilic organic material.

6. The method as claimed in claim 5, wherein the hydrophilic inorganic material is selected from the group consisting of $Al_2O_3$, $HfO_2$, $Ta_2O_5$, $La_2O_3$ and $SiO_2$.

7. The method as claimed in claim 6, wherein the hydrophilic inorganic material is formed using an atomic layer deposition (ALD) method or a sputtering method.

8. The method as claimed in claim 5, wherein the organic material is selected from the group consisting of AIDCN, polyaniline, Cd-AA(Arachidate), PVP, PVA and PEDOT.

9. The method as claimed in claim 8, wherein a surface of the organic material is made hydrophilic through an ultraviolet process using $O_3$ as a reaction gas or a plasma process using $O_2$ as a reaction gas.

10. The method as claimed in claim 9, wherein the organic material is deposited through any one of a spin coating method, a spraying method and a printing method.

11. The method as claimed in claim 1, wherein the buffer layer has a thickness of 2 to 20 nm.

12. The method as claimed in claim 1, wherein the buffer layer is deposited on the substrate at a temperature of 100 to 150° C.

13. The method as claimed in claim 1, wherein the nanoparticles are selected from the group consisting of HgTe, HgSe, HgS, CdTe, CdSe, CdS, ZnTe, ZnSe, ZnS, PbTe, PbSe, PbS and ZnO.

14. The method as claimed in claim 1, wherein the nanoparticle solution containing the precipitating agent is deposited on the substrate through any one of a spin coating method, a deep coating method, a stamping method, a spraying method and a printing method.

15. The method as claimed in claim 1, wherein the sintering step is carried out for 10 to 200 minutes at a temperature of 100 to 185° C.

16. The method as claimed in claim 1, wherein the gate insulation film is formed by depositing a dielectric material of high dielectric constant on the nanoparticle film, and the dielectric material is an inorganic material selected from the group consisting one of $Al_2O_3$, $HfO_2$, $Ta_2O_5$, $La_2O_3$, and $SiO_2$, or an organic material selected from the group consisting of AIDCN, polyaniline, Cd-AA(Arachidate), PVP, PVA, and PEDOT.

17. The method as claimed in claim 16, wherein when the dielectric material of high dielectric constant is deposited on the nanoparticle film, the substrate has a temperature of 100 to 185° C. and the gate dielectric film has a thickness of 10 to 500 nm.

* * * * *